(12) United States Patent
Forrest et al.

(10) Patent No.: US 7,601,910 B2
(45) Date of Patent: *Oct. 13, 2009

(54) ORGANIC PHOTOVOLTAIC DEVICES

(75) Inventors: Stephen R. Forrest, Princeton, NJ (US); Aharon Yakimov, Plainsboro, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 362 days.

This patent is subject to a terminal disclaimer.

(21) Appl. No.: 10/719,784

(22) Filed: Nov. 21, 2003

(65) Prior Publication Data

US 2004/0113546 A1    Jun. 17, 2004

Related U.S. Application Data

(63) Continuation of application No. 09/948,226, filed on Sep. 6, 2001, now Pat. No. 6,657,378.

(51) Int. Cl.
*H01L 31/06* (2006.01)
(52) U.S. Cl. .................. 136/263; 136/256; 257/40; 257/461; 257/464
(58) Field of Classification Search ........ 136/263, 136/249, 251, 256; 257/40, 461, 464, 431; 313/503, 506; 250/214.1, 208.1
See application file for complete search history.

(56) References Cited

U.S. PATENT DOCUMENTS

| | | | |
|---|---|---|---|
| 4,278,474 A | | 7/1981 | Blakeslee et al. |
| 4,316,049 A | * | 2/1982 | Hanak ..................... 136/244 |
| 4,479,028 A | * | 10/1984 | Sato et al. .................. 136/249 |
| 4,771,321 A | * | 9/1988 | Lewis ....................... 136/249 |
| 4,789,436 A | | 12/1988 | Greenbaum |
| 4,963,196 A | | 10/1990 | Hashimoto |
| 5,104,749 A | | 4/1992 | Sato et al. |
| 5,315,129 A | | 5/1994 | Forrest et al. |
| 5,350,644 A | | 9/1994 | Graetzel et al. |
| 5,456,762 A | | 10/1995 | Kariya et al. |
| 5,527,716 A | | 6/1996 | Kusian et al. |
| 5,703,436 A | | 12/1997 | Forrest et al. |

(Continued)

FOREIGN PATENT DOCUMENTS

EP    0 575 187    12/1993

(Continued)

OTHER PUBLICATIONS

Pettersson et al, "Modeling photocurrent action spectra of photovoltaic devices based on organic thin films," Journal of Applied Physics, vol. 86, No. 1. pp. 487-496, Jul. 1, 1999.*

(Continued)

*Primary Examiner*—Jeffrey T. Barton
(74) *Attorney, Agent, or Firm*—McDermott Will & Emery LLP (57) ABSTRACT

The present invention generally relates to organic photosensitive optoelectronic devices. More specifically, it is directed to organic photovoltaic devices, e.g., organic solar cells. Further, it is directed to an optimized organic solar cell comprising multiple stacked subcells in series. High power conversion efficiency are achieved by fabrication of a photovoltaic cell comprising multiple stacked subcells with thickness optimization and employing an electron blocking layer.

12 Claims, 9 Drawing Sheets

U.S. PATENT DOCUMENTS

| | | | |
|---|---|---|---|
| 5,837,391 A | 11/1998 | Utsugi | |
| 5,844,363 A | 12/1998 | Gu et al. | |
| 5,854,139 A * | 12/1998 | Aratani et al. | 438/780 |
| 5,917,279 A | 6/1999 | Elschner et al. | |
| 5,986,206 A | 11/1999 | Kambe et al. | |
| 6,049,090 A | 4/2000 | Clark, Jr. | |
| 6,097,147 A | 8/2000 | Baldo et al. | |
| 6,174,613 B1 | 1/2001 | Antoniadis et al. | |
| 6,198,091 B1 * | 3/2001 | Forrest et al. | 250/214.1 |
| 6,198,092 B1 * | 3/2001 | Bulovic et al. | 250/214.1 |
| 6,278,055 B1 * | 8/2001 | Forrest et al. | 136/263 |
| 6,297,495 B1 * | 10/2001 | Bulovic et al. | 250/214.1 |
| 6,333,458 B1 | 12/2001 | Forrest et al. | |
| 6,352,777 B1 * | 3/2002 | Bulovic et al. | 428/411.1 |
| 6,420,031 B1 | 7/2002 | Parthasarathy et al. | |
| 6,433,359 B1 | 8/2002 | Kelley et al. | |
| 6,451,415 B1 * | 9/2002 | Forrest et al. | 428/212 |
| 6,468,819 B1 | 10/2002 | Kim et al. | |
| 6,580,027 B2 * | 6/2003 | Forrest et al. | 136/263 |
| 6,657,378 B2 * | 12/2003 | Forrest et al. | 313/503 |
| 6,692,820 B2 * | 2/2004 | Forrest et al. | 428/212 |
| 6,774,300 B2 * | 8/2004 | McFarland | 136/255 |
| 2005/0224113 A1 * | 10/2005 | Xue et al. | 136/263 |
| 2005/0224905 A1 * | 10/2005 | Forrest et al. | 257/461 |

FOREIGN PATENT DOCUMENTS

| | | |
|---|---|---|
| WO | 00/11725 | 3/2000 |
| WO | WO 00/11725 A1 * | 3/2000 |

OTHER PUBLICATIONS

Peumans et al, "Efficient photon harvesting at high optical intensities in ultrathin organic double-heterostructure photovoltaic devices," Applied Physics Letters, vol. 76(19), pp. 2650-2652, May 8, 2000.*

Peumans et al "Efficient photon harvesting at high optical intensities in ultrathin organic double-heterstructure photovoltaic diodes", *Applied Physics Letters*, vol. 76, No. 19, pp. 2650-2652, May 8, 2000.

W.T. Welford and R. Winston, *High Collection Nonimaging Optics*, pp. 172-179, Academic Press, 1989.

M. Hiramoto, et al., "Effect of Thin Gold Interstitial-layer on the Photovoltaic Properties of Tandem Organic Solar Cell", *Chemistry Letters*, pp. 327-330 (1990).

L. Pettersson, et al., "Modeling photocurrent action spectra of photovoltaic devices based on organic thin films", Journal of Applied Physics, vol. 86, No. 1. pp. 487-496, Jul. 1, 1999.

J. Zhang et al., "Photovoltaic properties of porphyrin solid films with electric-field induction", Thin Solid Films, 284-285, (1996), pp. 596-599.

D. Bonnet, et al., "Organic Solar Cells—an Experimental Study", $13^{th}$ European Photovoltaic Solar Energy Conference, Oct. 23-27, 1995, Nice, France, pp. 1685-1688.

Abstract for JP 63-300574A, Dec. 7, 1998.

<http://www.oksolar.com/solar_panels/unisolar_flexibles.htm>, "Uni-solar Flexible (USF) Unbreakable Solar Panels—Triple Junction", printed Sep. 14, 2004.

"Uni-Power Solar Electric Modules Specification Sheet, Models US-64, US-42, US-32", printed from the OKSolar.com website on Sep. 14, 2004 <http://www.oksolar.com/pdf/solar_energy_catalog/unisolar_us-64.pdf>.

"Amorphous Silicon (a-Si) Solar Technology", printed from United Solar Ovonic Corp. website on Sep. 14, 2004, <http://www.uni-solar.com/Our_Technology_a_Si.html>.

S. Guha, et al., "Amorphous Silicon Alloy Photovoltaic Research Present and Future", Progress in Photovoltaics: Research and Applications, Prog. Photovolt. Res. Appl. 8, pp. 141-150 (2000).

* cited by examiner

ORGANIC PHOTOVOLTAIC DEVICES

RELATED APPLICATIONS

This application is a continuation of U.S. application Ser. No. 09/948,226, filed Sept. 6, 2001, now U.S. Pat. No. 6,657,378.

UNITED STATES GOVERNMENT RIGHTS

This invention was made with Government support under Grant No. DMR-9400362 awarded by the National Science Foundation. The government has certain rights in this invention.

FIELD OF INVENTION

The present invention generally relates to organic photosensitive optoelectronic devices. More specifically, it is directed to organic photovoltaic devices, e.g., organic solar cells. Further, it is directed to an optimized organic solar cell comprising multiple stacked subcells in series.

BACKGROUND OF THE INVENTION

Optoelectronic devices rely on the optical and electronic properties of materials to either produce or detect electromagnetic radiation or to generate electricity from ambient electromagnetic radiation. Photosensitive optoelectronic devices convert electromagnetic radiation into electricity. Solar cells, also known as photovoltaic (PV) devices, are used to generate electrical power from ambient light. PV devices are used to drive power consuming loads to provide, for example, lighting, heating, or to operate electronic equipment such as computers or remote monitoring or communications equipment. These power generation applications often involve the charging of batteries or other energy storage devices so that equipment operation may continue when direct illumination from the sun or other ambient light sources is not available. As used herein, the term "resistive load" refers to any power consuming or storing device, equipment or system.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

Solar cells are characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices produce a photo-generated voltage when they are connected across a load and are irradiated by light. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have values, $I_{max}$ and $V_{max}$, respectively.

A figure of merit for solar cells is the fill factor, ff, defined as:

$$ff = \frac{I_{max} V_{max}}{I_{SC} V_{OC}} \quad (1)$$

where ff is always less than 1, as $I_{SC}$ and $V_{OC}$ are never obtained simultaneously in actual use. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \Rightarrow S_0^*$. Here $S_0$ and $S_0^*$ denote ground and excited molecular states, respectively. This energy absorption is associated with the promotion of an electron from a bound state in the HOMO, which may be a π-bond, to the LUMO, which may be a π*-bond, or equivalently, the promotion of a hole from the LUMO to the HOMO. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair must become separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n, or donor, type or p, or acceptor, type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor, or n-type, character for PTCDA, experiments indicate that hole mobilities exceed electron mobilities by several orders of magnitude so that the hole mobility is a critical factor. The result is that device configuration predictions from donor/acceptor criteria may not be borne out by actual device performance. Due to these unique electronic properties of organic materials, rather than designating them as "p-type" or "acceptor-type" and "n-type" or "donor-type", the nomenclature of "hole-transporting-layer" (HTL) or "electron-transporting-layer" (ETL) is frequently used. In this designation scheme, an ETL will be preferentially electron conducting and an HTL will be preferentially hole transporting.

A typical prior art photovoltaic device configuration is the organic bilayer cell. In the bilayer cell, charge separation predominantly occurs at the organic heterojunction. The built-in potential is determined by the HOMO-LUMO energy difference between the two materials contacting to form the heterojunction. The HOMO-LUMO gap offset between the HTL and ETL produce an electric field around the HTL/ETL interface.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization. However, the diffusion length ($L_D$) of an exciton is typically much less ($L_D$~50 Å) than the optical absorption length (~500 Å), requiring a trade off between using a thick, and therefore resistive, cell with multiple or highly folded interfaces, or a thin cell with a low optical absorption efficiency. Different approaches to increase the efficiency have been demonstrated, including use of doped organic single crystals, conjugated polymer blends, and use of materials with increased exciton diffusion length. The problem was attacked yet from another direction, namely employment of different cell geometry, such as three-layered cell, having an additional mixed layer of co-deposited p- and n-type pigments, or fabricating tandem cell.

As was shown in previous work, the open circuit voltage ($V_{OC}$) of the tandem cell can be almost two times higher than that of the single cell. M. Hiramoto, M. Suezaki, and M. Yokoyama, *Chemistry Letters*, 327 (1990). Unfortunately, the obtained power conversion efficiency was less than for the single cell. That was attributed to the fact that the front cell attenuates light intensity coming to the back cell. Therefore the photocurrent produced by the back cell is reduced, thus limiting the power conversion efficiency. Additional reasoning was that doubling of the overall thickness in tandem devices results in increased series resistance, that also could affect the power conversion efficiency.

In order to increase the cell performance, materials and device configurations are desirable which can enhance the quantum yield and, therefore, the power conversion efficiency. We have now achieved high power conversion efficiency by fabrication of a photovoltaic cell comprising multiple stacked subcells with thickness optimization and employing an electron blocking layer.

SUMMARY AND OBJECTS OF INVENTION

The present invention provides organic-based photosensitive optoelectronic devices with greatly improved efficiency. These devices comprise multiple stacked subcells in series between an anode layer and a cathode. Each subcell comprises an electron donor layer, and an electron acceptor layer in contact with the electron donor layer. The subcells are separated by an electron-hole recombination zone. Advantageously, the device also includes one or more exciton blocking layers (EBL) and a cathode smoothing layer.

It is an object of the present invention to provide an organic PV device with improved photovoltaic performance. To this end, the invention provides an organic PV device capable of operating with a high external quantum efficiency.

Another object of the present invention is to provide organic photosensitive optoelectronic devices with improved absorption of incident radiation for more efficient photogeneration of charge carriers.

It is a further objective of the present invention to provide organic photosensitive optoelectronic devices with an improved $V_{OC}$ and an improved $I_{SC}$.

BRIEF DESCRIPTION OF THE DRAWINGS

The foregoing and other features of the present invention will be more readily apparent from the following detailed description of exemplary embodiments taken in conjunction with the attached drawings.

FIG. 2 illustrates the proposed energy level diagram of a tandem device as depicted in FIG. 1. The operation of this cell is as follows: a photon is absorbed in one of the two subcells, generating an exciton, which can diffuse in the organic films. CuPc/PTCBI interfaces provide an active site for the exciton dissociation. Upon dissociation of the light-generated excitons at the CuPc/PTCBI interfaces, the holes (open circles) are transported in the CuPc layers, while the electrons (filed circles) are transported in the PTCBI layers. Holes, which are generated in the front cell are collected by the ITO electrode. Electrons, which are generated in the back cell are collected by the Ag cathode. Holes from the back cell and electrons from the front cell are transported towards the Ag layer between the subcells, where they recombine.

DETAILED DESCRIPTION

The present invention provides stacked organic photosensitive optoelectronic devices comprised of multiple subcells. Each subcell comprises a donor-acceptor heterojunction. The subcells are separated by an electron-hole recombination zone. In preferred embodiments of the present invention, the electron-hole recombination zone comprises an ultra-thin metal layer which may be discontinuous. The devices of the present invention may comprise two or more subcells. Preferably, the devices will be comprised of two to five subcells. The organic photoconductive layers may be fabricated using vacuum deposition, spin coating, organic vapor-phase deposition, inkjet printing and other methods known in the art.

The open circuit voltage of the heterojunction cell is largely independent of the electrode materials and is determined by the value of HOMO-LUMO gap energy offset between the organic thin films, as well as their impurity doping concentrations. Therefore, one can expect that the performance of an ITO/organic bi-layer/metal cell, as well as metal/organic bi-layer/metal cell will be mostly affected by the parameters of the organic bi-layer materials. Subsequent deposition of two or more heterojunctions will lead to the formation of an inverse heterojunction between the acceptor layer of the front cell and the donor layer of the back cell. To prevent formation of this inverse heterojunction, an electron-hole recombination zone is inserted between the individual subcells. The electron-hole recombination zone provides a space for the recombination of electrons approaching from the front cell and holes from the back cell.

A PV device comprised of subcells electrically connected in series produces a higher voltage device. The donor-material and acceptor-material which provide the heterojunctions for the subcells may be the same for the various subcells or the donor- and acceptor materials may be different for the subcells of a particular device. It is important that each subcell in the device be "balanced"; that is, that the amount of current generated by each subcell be about equal. It is preferred that each subcell generates the same current, with a deviation of less than about 10%. The current balancing is achieved by adjusting the thickness of the individual layers in a subcell and by choice of material which comprises the individual layers in a subcell. For example, if the incident radiation passes through in only one direction, the stacked subcells may have an increasing thickness with the outermost subcell, which is most directly exposed to the incident radiation, being the thinnest subcell. Alternatively, if the subcells are superposed on a reflective surface (for example, a metal cathode), the thicknesses of the individual subcells may be adjusted to account for the total combined radiation admitted to each subcell from the original and reflected directions. We have found that by balancing the subcells in a device, optimal performance can be achieved.

In addition to absorption, exciton diffusion length is an important considerations when choosing layer thickness. An exciton produced by an absorption must be sufficiently near to a donor-acceptor interface. The photo-generated exciton must diffuse to a donor-acceptor interface prior to geminate recombination to allow charge separation to occur. Both absorption and diffusion are easily modelled to achieve optimal cell thickness, as they are both exponential functions of distance.

The current generated by a device comprised of multiple subcells is equal to the smallest of the currents generated by the "series-connected" subcells. When the layers of the individual subcells are of a thickness much larger than the exciton diffusion length, $L_d$, the current is limited by the backmost subcell, since the current is proportional to the light intensity, which is attenuated by the forward subcells. To reduce the attenuation factor one can reduce the distance between front and back heterojunction interfaces, generally speaking, until the individual layer thickness becomes of the order of the active region width, i.e. of the order of $L_d$ ~30 Å to ~100 Å.

The organic photosensitive optoelectronic devices of the present invention may function as a solar cell, photodetector or photocell. Whenever the organic photosensitive optoelectronic devices of the present invention function as solar cells, the materials used in the photoconductive organic layers and the thicknesses thereof may be selected, for example, to optimize the external quantum efficiency of the device. Whenever the organic photosensitive optoelectronic devices of the present invention function as photodetectors or photocells, the materials used in the photoconductive organic layers and the thicknesses thereof may be selected, for example, to maximize the sensitivity of the device to desired spectral regions.

In particular, the thicknesses of the individual layers may be adjusted so that in combination with selecting the total number of subcells in the stacked device, the external quantum efficiency of the device may be optimized so as to obtain an external quantum efficiency that is higher than that which is possible for a single cell. The term "external quantum efficiency" is used herein to refer to the efficiency with which a photosensitive optoelectronic device is capable of converting the total incident radiation into electrical power, as distinct from the term "internal quantum efficiency," which is used herein to refer to the efficiency with which a photosensitive optoelectronic device is capable of converting the absorbed radiation into electrical power. Using these terms, a stacked photosensitive optoelectronic device may be designed to achieve an external quantum efficiency, under a given set of ambient radiation conditions, that approaches the maximum internal quantum efficiency that may be achieved for an individual subcell under such ambient conditions.

This result may be achieved by considering several guidelines that may be used in the selection of layer thicknesses. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$ (where $\alpha$ is the absorption coefficient), so that nearly all of the radiation incident on the solar cell is absorbed to produce excitons. Furthermore, the photoconductive layer thickness should be as thin as possible to avoid excess series resistance due to the high bulk resistivity of organic semiconductors.

Accordingly, these competing guidelines inherently require tradeoffs to be made in selecting the thickness of the photoconductive organic layers of a photosensitive optoelectronic cell. Thus, on the one hand, a thickness that is comparable or larger than the absorption length is desirable (for a single cell device) in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high quantum efficiency for the overall device. By using multiple stacked subcells, the photoconductive organic layers may be made very thin.

In particular, by taking the above-noted competing effects into account, that is, the absorption length of the photoconductive materials in the device, the diffusion length of the excitons in these materials, the photocurrent generation efficiency of these excitons, and the resistivity of these materials, the thickness of the layers in an individual cell may be adjusted so as to obtain a maximum internal quantum efficiency for those particular materials for a given set of ambient radiation conditions. Since the diffusion length of the excitons tends to have a relatively small value and the resistivity of typical photoconductive materials tends to be relatively large, an optimal subcell with respect to achieving the maximum internal quantum efficiency would typically be a relatively thin device. However, since the absorption length for such photoconductive organic materials tends to be relatively large as compared with the exciton diffusion length, such thin optimal photosensitive optoelectronic subcells, which may have the maximum internal quantum efficiency, would tend to have a relatively low external quantum efficiency, since only a small fraction of the incident radiation would be absorbed by such optimal subcells.

To improve the external quantum efficiency of an individual subcell, the thickness of the photoconductive organic layers may be increased so as to absorb significantly more incident radiation. Although the internal quantum efficiency for converting the additionally absorbed radiation into electrical power might gradually decrease as the thickness is increased beyond its optimal subcell thickness, the external quantum efficiency of the subcell would still increase until a certain thickness is reached where no further increase in absorption could produce an increase in external quantum efficiency. Since the internal quantum efficiency of the subcell tends to drop rather sharply as the thickness of the photoconductive layers increases much beyond the diffusion length of the photo-generated excitons, the maximum external quantum efficiency of the subcell may be achieved well before the thickness of the thicker subcell is sufficient to absorb substantially all the incident radiation. Thus, the maximum external quantum efficiency that may be achieved using this single, thicker-cell approach is limited not only by the fact that the subcell thickness may be significantly greater than that desired for achieving the maximum internal quantum efficiency but, in addition, such thicker subcells may still not absorb all the incident radiation. Thus, due to both of these effects, the maximum external quantum efficiency of the thicker subcell would be expected to be significantly less than the maximum internal quantum efficiency that can be achieved for an optimal subcell having the optimal thickness.

When the thickness of an individual subcell is less than the active region thickness, further thinning of the subcell results in reduced absorption, which results in a linear decrease in efficiency. Since there is a balance of the currents in each subcell, the maximum number of subcells in a device of the invention corresponds to the cell thickness that still permits this balance. Each subcell in the stack should be as thick as the active region for that cell and still allow for cells deep within the stack to generate as much current as is consistent with the balance criterion.

Each subcell of the stacked device comprises an acceptor material and a donor material which provide a heterojunction. The donor material has an ionization potential that is smaller than that of the acceptor material. Further, the ionization potential HOMO/LUMO gap of the donor layer must be smaller than that of the acceptor layer. Generally, the materials comprising the donor or acceptor layers should have the longest possible exciton diffusion length, and thus are preferably those materials which lend themselves to ordered stacking of the molecules, such as planar, aromatic molecules.

The acceptor material may be comprised of, for example, perylenes, naphthalenes, fullerenes or nanotubules. A preferred acceptor material is 3,4,9,10-perylenetetracarboxylic bis-benzimidazole (PTCBI). Alternatively, the acceptor layer may be comprised of a fullerene material as described in the co-pending U.S. application Ser. No. 09/878,523, now U.S. Pat. No. 6,580,027, incorporated herein by reference.

Adjacent to the acceptor layer, is a layer of organic donor-type material. The boundary of the acceptor layer and the donor layer forms the heterojunction which produces an internally generated electric field. A preferred material for the donor layer is a pthalocyanine or a porphyrin, or a derivative or transition metal complex thereof. Copper pthalocyanine (CuPc) is a particularly preferred donor material.

The individual subcells of the stacked devices are separated by an electron-hole recombination zone. This layer serves to prevent the formation of an inverse heterojunction between the acceptor layer of the front cell and the donor layer of the back cell. The layer between the individual subcells provides a recombination zone for electrons approaching from the front subcell and holes from the back subcell. The effective recombination of electrons from the front subcell and holes from the back subcell is necessary if a photo-induced current is to be achieved in the stacked device. Preferably, the electron-hole recombination zone comprises a thin metal layer. The metal layer must be thin enough to be semi-transparent in order to allow light to reach the back cell(s). To this end, it is preferred that the metal layer be less than about 20 Å thick. It is especially preferred that the metal film be about 5 Å thick. It is believed that these ultra-thin metal films (~5 Å) are not continuous films but rather are composed of isolated metal nanoparticles. Surprisingly, although the ultra-thin metal layer is not continuous, it still provides an efficient layer for electron-hole recombination. Preferred materials for use in this layer include Ag, Li, LiF, Al, Ti, and Sn. Silver is a particularly preferred metal for this layer. Gold is not believed to be a good choice for this layer as it is not known to introduce mid-gap states. In an alternative embodiment, the electron-hole recombination zone comprises a region of electronically active defects which lead to rapid electron-hole recombination. The defects may be introduced by limited damage at this interface, for example, by heating, by controlled impurity introduction, or by exposure to energetic particles during the deposition of the relevant organic layers. The energetic particles may be excited, for example, thermally or by an RF plasma.

The electrodes, or contacts, used in a photosensitive optoelectronic device are an important consideration, as shown in co-pending applications Ser. Nos. 09/136,342, both incorporated herein by reference. When used herein, the terms "electrode" and "contact" refer to layers that provide a medium for delivering photo-generated power to an external circuit or providing a bias voltage to the device. That is, an electrode, or contact, provides the interface between the photoconductively active regions of an organic photosensitive optoelectronic device and a wire, lead, trace or other means for transporting the charge carriers to or from the external circuit. In a photosensitive optoelectronic device, it is desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. That is, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some, but less that 50% transmission of ambient electromagnetic radiation in relevant wavelengths are said to be "semi-transparent".

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Embodiments of the present invention may include, as one or more of the transparent electrodes of the photosensitive optoelectronic device, a highly transparent, non-metallic, low resistance cathode such as disclosed in U.S. patent application Ser. No. 09/054,707 to Parthasarathy et al. ("Parthasarathy '707"), or a highly efficient, low resistance metallic/non-metallic compound cathode such as disclosed in U.S. Pat. No. 5,703,436 to Forrest et al. ("Forrest '436"), both incorporated herein by reference. Each type of cathode is preferably prepared in a fabrication process that includes the step of sputter depositing an ITO layer onto either an organic material, such as copper phthalocyanine (CuPc), to form a highly transparent, non-metallic, low resistance cathode or onto a thin Mg:Ag layer to form a highly efficient, low resistance metallic/non-metallic compound cathode. Parthasarathy '707 discloses that an ITO layer onto which an organic layer had been deposited, instead of an organic layer onto which the ITO layer had been deposited, does not function as an efficient cathode.

Herein, the term "cathode" is used in the following manner. In a non-stacked PV device or a single unit of a stacked PV device under ambient irradiation and connected with a resistive load and with no externally applied voltage, e.g., a solar cell, electrons move to the cathode from the adjacent photoconducting material. Similarly, the term "anode" is used herein such that in a solar cell under illumination, holes move to the anode from the adjacent photo-conducting material, which is equivalent to electrons moving in the opposite manner. It will be noted that as the terms are used herein, anodes and cathodes may be electrodes or charge transfer layers.

In a preferred embodiment of the invention, the stacked organic layers include one or more exciton blocking layers (EBLs) as described in U.S. Pat. No. 6,097,147, Peumans et al, *Applied Physics Letters* 2000, 76, 2650-52, and co-pending application Ser. No. 09/449,801, filed Nov. 26, 1999, both incorporated herein by reference. Higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

It is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL will necessarily block one sign of charge carrier. By design, an EBL will always exist between two layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. For example, it is desirable for a material used as a cathode side EBL to have a LUMO level closely matching the LUMO level of the adjacent ETL material so that any undesired barrier to electrons is minimized.

It should be appreciated that the exciton blocking nature of a material is not an intrinsic property of its HOMO-LUMO energy gap. Whether a given material will act as an exciton blocker depends upon the relative HOMO and LUMO levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an organic PV device.

In a preferred embodiment of the invention, an EBL is situated between the acceptor layer and the cathode (back subcell). A preferred material for the EBL comprises 2,9-dimethyl-4,7-diphenyl-1,10-phenanthroline (also called bathocuproine or BCP), which is believed to have a LUMO-HOMO separation of about 3.5 eV, or bis(2-methyl-8-hydroxyquinolinoato)-aluminum(III)phenolate ($Alq_2OPH$). BCP is an effective exciton blocker which can easily transport electrons to the cathode from the adjoining acceptor layer. Generally, an EBL will not be included in the forward subcells. Positioning an EBL adjacent to the electron-hole recombination zone may prevent the charge carriers from reaching the recombination zone and thereby reduce cell efficiency.

The EBL layer may be doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. It is thought that the BCP as deposited in the present devices is amorphous. The present apparently amorphous BCP exciton blocking layers may exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

Representative embodiments may also comprise transparent charge transfer layers. As described herein charge transfer layers are distinguished from ETL and HTL layers by the fact that charge transfer layers are frequently, but not necessarily, inorganic and they are generally chosen not to be photoconductively active. The term "charge transfer layer" is used herein to refer to layers similar to but different from electrodes in that a charge transfer layer only delivers charge carriers from one subsection of an optoelectronic device to the adjacent subsection.

In another preferred embodiment of the invention, a charge transfer layer is situated between the anode and the donor layer. A preferred material for this layer comprises a film of 3,4-polyethylenedioxythiophene:polystyrenesulfonate (PEDOT:PSS). The PEDOT:PSS layer functions as an anode smoothing layer. The introduction of the PEDOT:PSS layer between the anode (ITO) and the donor layer (CuPc) leads to fabrication yields of close to 100%. We attribute this to the ability of the spin-coated PEDOT:PSS film to planarize the ITO, whose rough surface could otherwise result in shorts through the thin molecular film.

In a further embodiment on the invention, one or more of the layers may be treated with plasma prior to depositing the next layer. The layers may be treated, for example, with a mild argon or oxygen plasma. This treatment is beneficial as it reduces the series resistance. It is particularly advantageous that the PEDOT:PSS layer be subject to a mild plasma treatment prior to deposition of the next layer.

A concentrator configuration can be employed to increase the efficiency of the device, where photons are forced to make multiple passes through the thin absorbing regions. Co-pending U.S. patent application Ser. No. 09/449,800 entitled "Highly Efficient Multiple Reflection Photosensitive Optoelectronic Device with Optical Concentrator"(hereinafter "'800 Application"), incorporated herein by reference, addresses this issue by using structural designs that enhance the photoconversion efficiency of photosensitive optoelectronic devices by optimizing the optical geometry for high absorption and for use with optical concentrators that increase collection efficiency. Such geometries for photosensitive devices substantially increase the optical path through the material by trapping the incident radiation within a reflective cavity or waveguiding structure, and thereby recycling light by multiple reflection through the thin film of photoconductive material. The geometries disclosed in the '800 Application therefore enhance the external quantum efficiency of the devices without causing substantial increase in bulk resistance. Included in the geometry of such devices is a first reflective layer; a transparent insulating layer which should be longer than the optical coherence length of the incident light in all dimensions to prevent optical microcavity interference effects; a transparent first electrode layer adjacent the transparent insulating layer; a photosensitive heterostructure adjacent the transparent electrode; and a second electrode which is also reflective.

The '800 Application also discloses an aperture in either one of the reflecting surfaces or an external side face of the waveguiding device for coupling to an optical concentrator, such as a Winston collector, to increase the amount of electromagnetic radiation efficiently collected and delivered to the cavity containing the photoconductive material. Exemplary non-imaging concentrators include a conical concentrator, such as a truncated paraboloid, and a trough-shaped concentrator. With respect to the conical shape, the device collects radiation entering the circular entrance opening of diameter $d_1$ within $\pm\theta_{max}$(the half angle of acceptance) and directs the radiation to the smaller exit opening of diameter $d_2$ with negligible losses and can approach the so-called thermodynamic limit. This limit is the maximum permissible concentration for a given angular field of view. Conical concentrators provide higher concentration ratios than trough-shaped concentrators but require diurnal solar tracking due to the smaller acceptance angle. (After *High Collection Nonimaging Optics* by W. T. Welford and R. Winston, (hereinafter "Welford and Winston") pp 172-175, Academic Press, 1989, incorporated herein by reference).

Devices have been constructed and example data recorded for exemplary embodiments of the present invention. The following examples of the invention are illustrative and not limiting of the invention.

EXAMPLES

Exemplary embodiments are fabricated on pre-cleaned ITO glass substrates, spin-coated with a 300 Å thick layer of polyethylenedioxythiophene: poystyrenesulfonate (PEDOT). Spin coating is performed at 4000 rpm for 40 sec, and is followed by 30 min drying at 110° C. for 1 hour at reduced pressure. The organic materials are purified by train sublimation. The PV cells are formed by thermal evaporation (room temperature, $10^{-6}$ Torr, deposition rate of 1.5-2 Å/sec) of organic materials on the ITO/PEDOT glass in the following sequence: donor-acceptor-metal-donor-acceptor-metal. The thickness of individual layers is controlled by use of, for example, a crystal oscillator thickness monitor. Copper phthalocyanine, CuPc, is used as a donor, and perylenetetracarboxylic bis-benzimidazole (PTCBI) as an acceptor. Ag is used for the thin (~5-20 Å) layer between the front and the back cells and as a top metal electrode material. The top electrode (of 800 Å thickness) is deposited through shadow mask of circular shape of 1 mm diameter.

Figure 1:
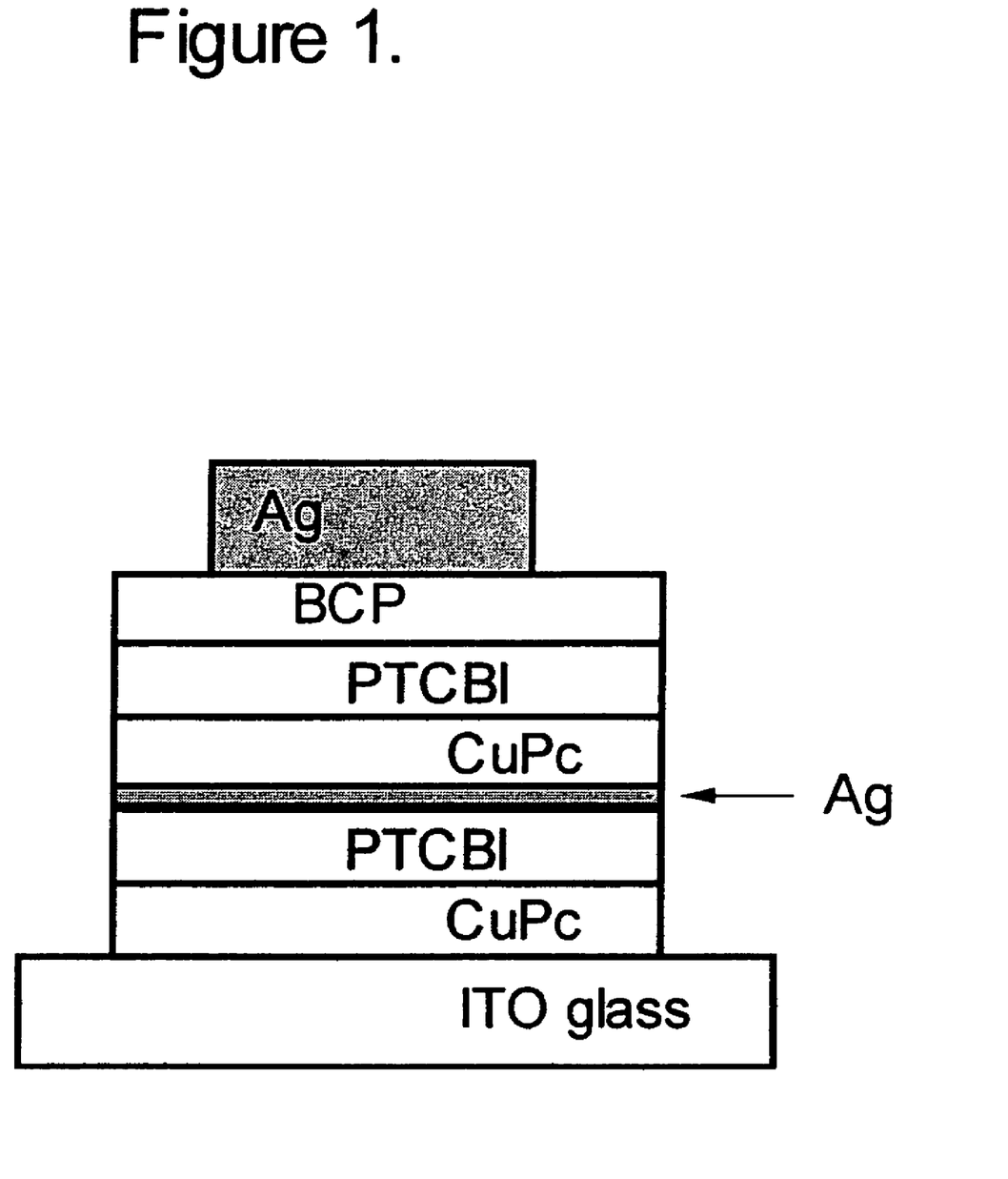
FIG. 1 depicts a tandem (consisting of two subcells) device. Each subcell comprises a copper phthalocyanine (CuPc)/3,4,9,10-perylenetetracarboxylic-bis-benzimidazole (PTCBI) heterojunction. The two subcells of the tandem device are separated by a thin layer of silver. Between the back subcell and the Ag cathode is depicted an electron blocking layer consisting of BCP.
Figure 2:
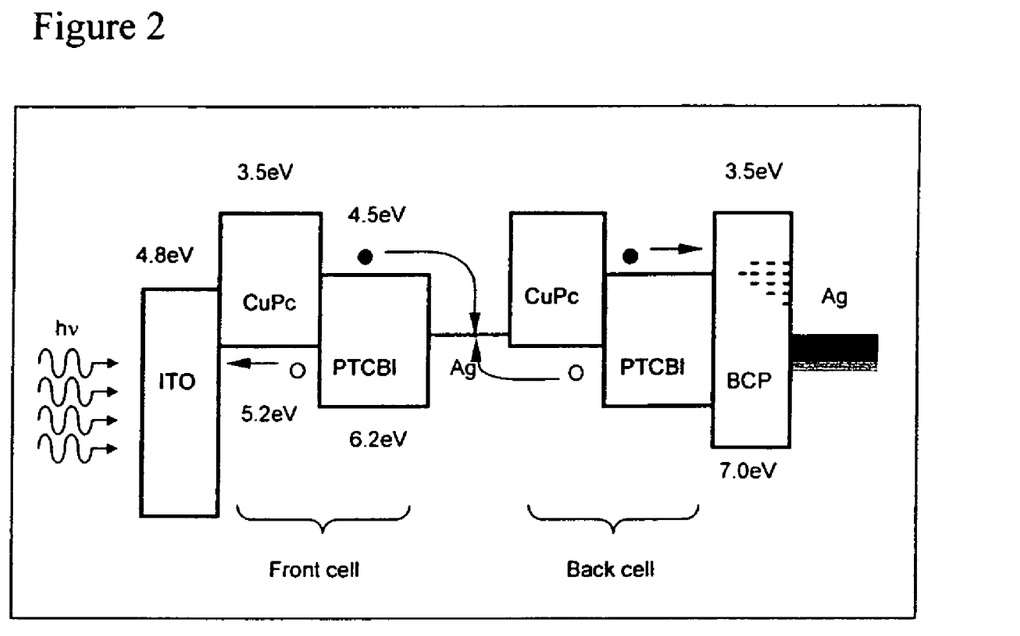
Figure 3:
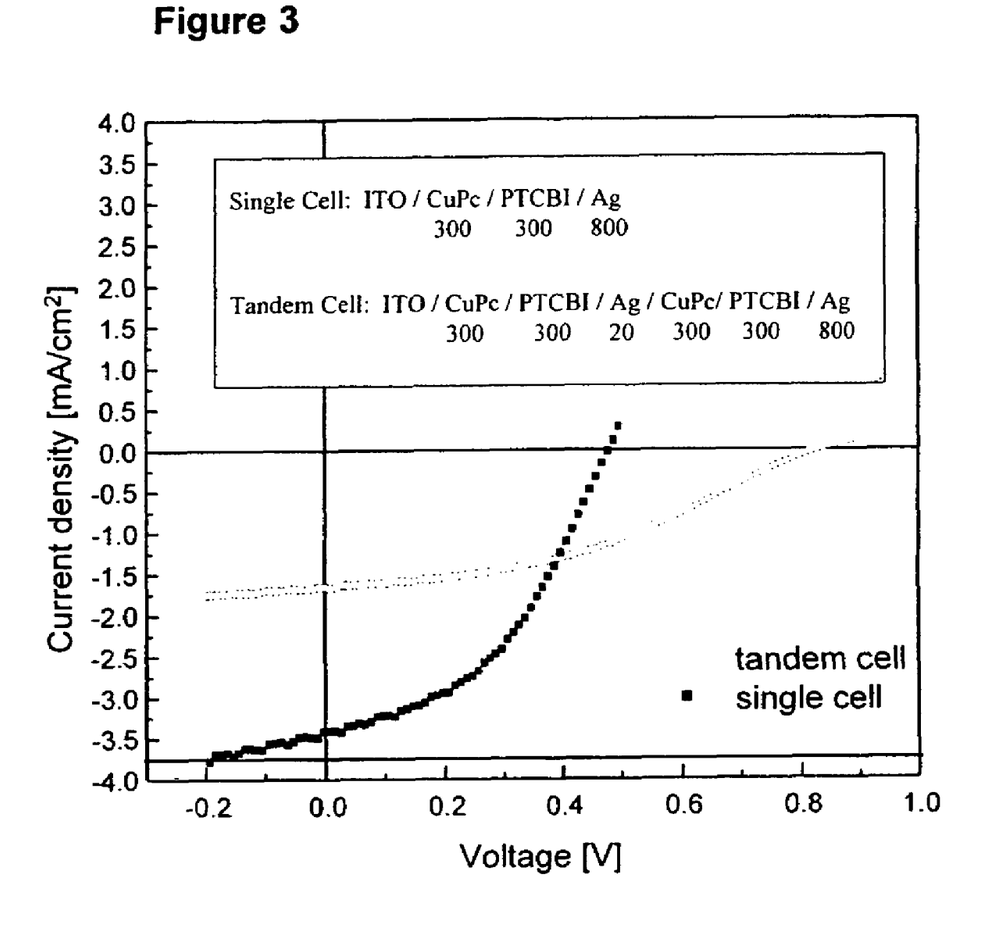
FIG. 3 shows the I-V characteristics (current density vs. voltage) of a tandem device before optimization (open squares) and a single cell device (filled squares) under 1 sun illumination. The cell structures are as follows: substrate/300 Å CuPc/300 Å PTCBI/20 Å Ag/300 Å CuPc/300 Å PTCBI/800 Å Ag—for tandem device, and substrate/300 Å CuPc/300 Å PTCBI/800 Å Ag for the single cell device.
Figure 4:
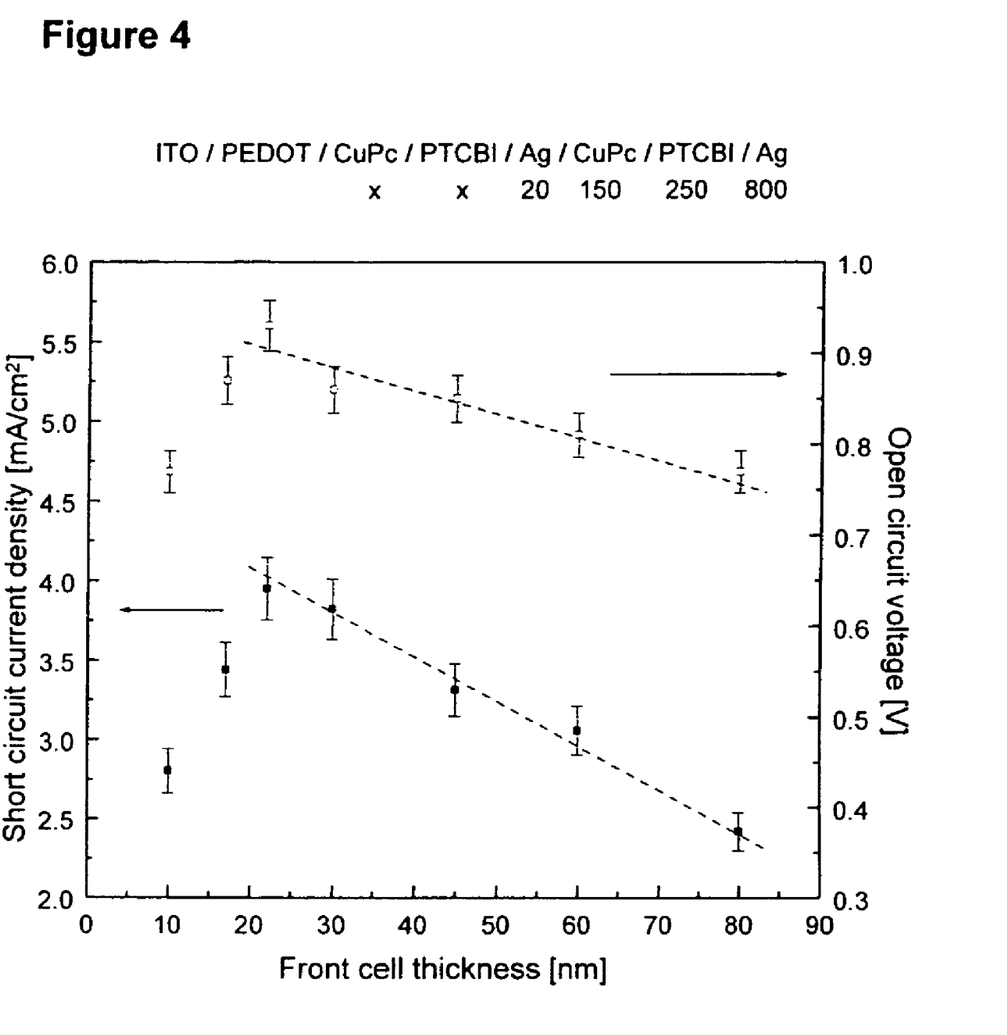
FIG. 4 shows the short circuit current density (left axis) and open circuit voltage (right axis) for tandem cells, having front cells of different thicknesses. The measurements are performed under 1 sun illumination. Note both $I_{SC}$ and $V_{OC}$ have a maximum around 220 Å front cell thickness. This corresponds to the front cell structure: 110 Å CuPc/110 Å PTCBI. For devices with the thickness of the front cell larger than 220 Å, $I_{SC}$ decreases due to increased optical absorption in the front cell which leads to lower light intensity at the back cell, which limits the device current. For thicknesses smaller than 220 Å, $I_{SC}$ decreases due to substrate roughness, as well as island formation in the organic layers.

Power conversion efficiency was measured in air under illumination of a solar simulator giving AM1.5 white light. The light intensity was varied using neutral density filters. The current-voltage (I-V) characteristics of single (closed squares) and tandem (open squares) cells at 1 sun incident light intensity are shown in FIG. 1. The cell structure is as follows: substrate/300 Å CuPc/300 Å PTCBI/20 Å Ag/300 Å CuPc/300 Å PTCBI/800 Å Ag— for tandem, and substrate/ 300 Å CuPc/300 Å PTCBI/800 Å Ag for regular, single cell. The open circuit voltage produced by the tandem cell is doubled, as compared to the single cell. Although the photovoltage from the tandem cell is doubled, the short circuit current of the tandem cell is significantly lower than that of the single cell.

We have compared clean ITO glass with ITO covered with PEDOT as a substrate for PV devices. It turns out that for the thinnest devices (with individual layer thickness of less than about 100 Å), a pre-deposited PEDOT layer prevents appearance of short circuits, presumably due to lower surface roughness, as compared to ITO. Indeed, the AFM measurements revealed the roughness values of about 20 Å and 45 Å for PEDOT and bare ITO respectively.

For devices with layer thickness less than 300 Å, the $V_{oc}$ is somewhat higher for devices prepared on PEDOT-substrate, while the short circuit current ($I_{sc}$) is slightly lower. Increased photovoltage produced by devices containing PEDOT layer is especially pronounced in CuPc/$C_{60}$ device, indicating that the photovoltage may be originated in both energy bands mismatch and the difference of the electrodes work functions.

In contrast to thinner films, for the devices having layer thickness of about 350 Å and thicker, use of bare ITO substrate is advantageous. This is due to the fact that the morphology of the substrate become less important for such devices, while additional layer of PEDOT is a source of parasitic absorption as well as additional series resistance.

Figure 5:
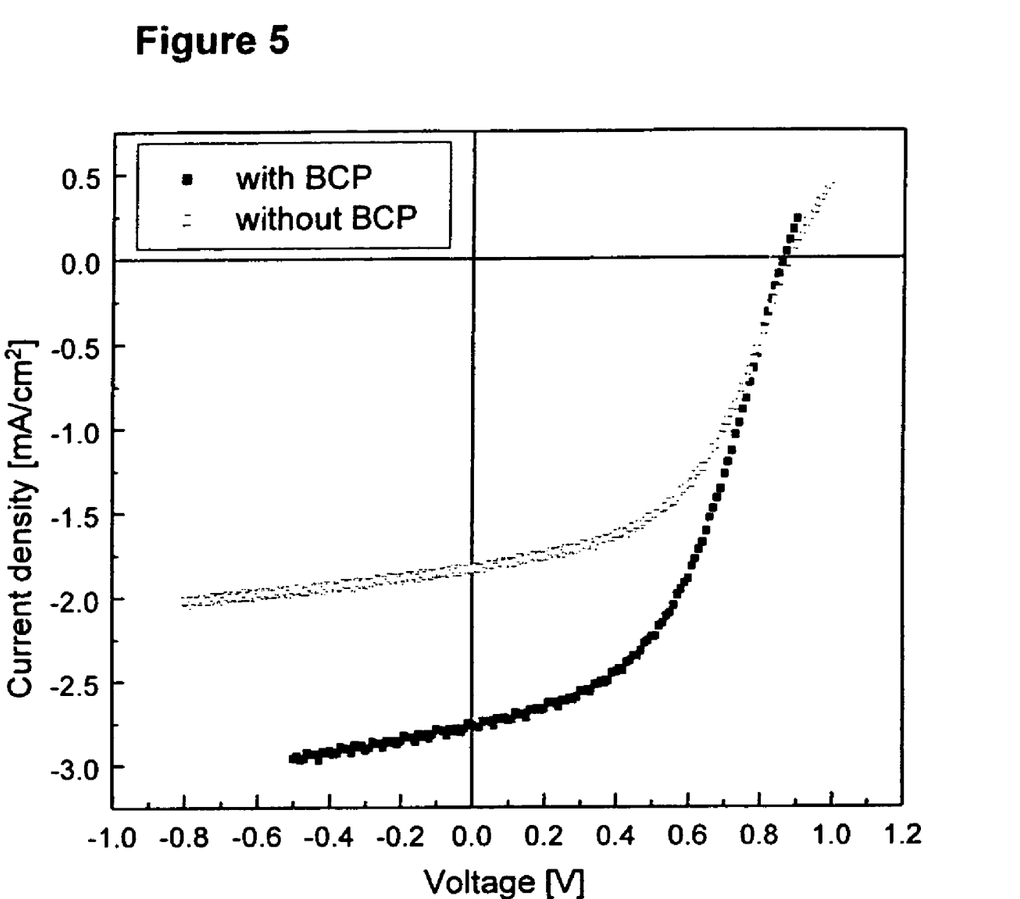
FIG. 5 shows a comparison of the I-V characteristics of two tandem cells: one with a BCP layer (filled squares) and another without (open squares). The BCP layer is incorporated in the back cell. The measurement is performed at 1 sun illumination. A significant increase of the photocurrent density can be clearly seen for the tandem cell having a BCP layer, thus confirming the usefulness of the EBL concept to tandem PV cells.
Figure 6:
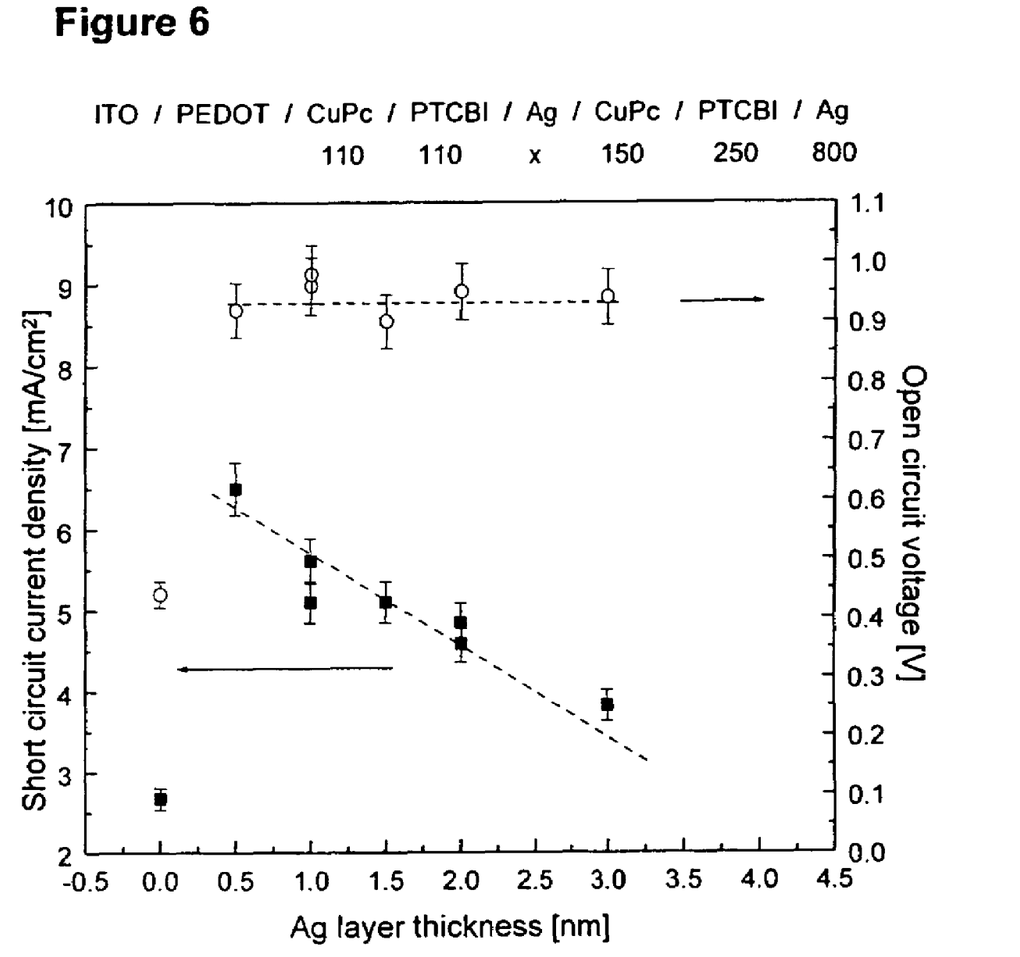
FIG. 6 shows the Ag layer thickness dependence of the short circuit current density ($I_{SC}$) and the open circuit voltage ($V_{OC}$) produced by a tandem cell under AM 1.5 1 sun illumination. While the $V_{OC}$ remains constant, the $I_{SC}$ increases considerably upon decrease of the Ag layer thickness, and reaches its maximum value at the minimum Ag layer thickness deposited (5 Å). $V_{OC}$ and $I_{SC}$ show significant drop for the device without an Ag layer. The observed dependence of the cell performance on the thickness of the Ag interlayer indicates that even a very small amount of Ag inserted between the front and the back subcells is enough to provide recombination sites at the interface between them.
Figure 7:
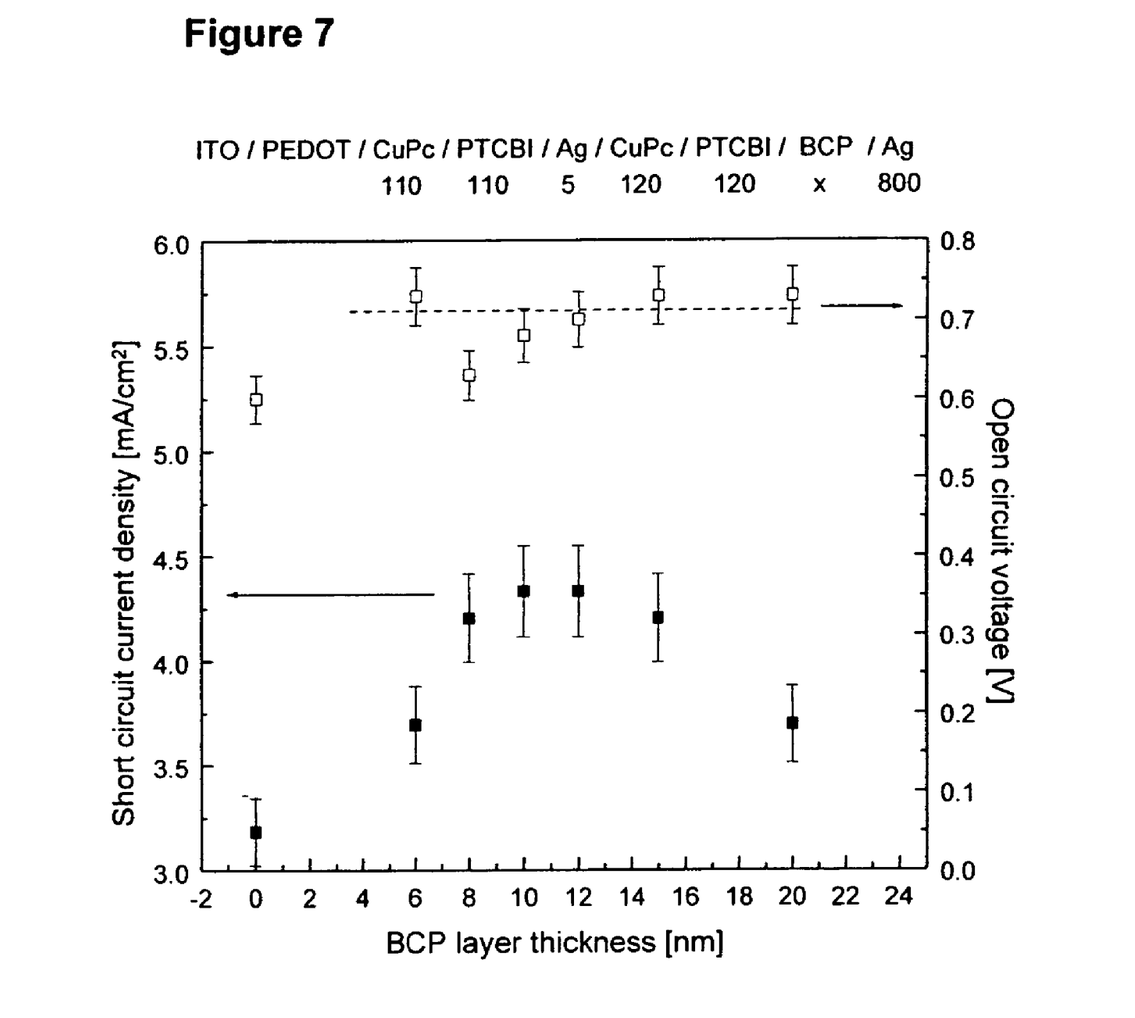
FIG. 7 shows the BCP layer thickness dependence of the short circuit current density ($I_{SC}$) and the open circuit voltage ($V_{OC}$) produced by a tandem cell under AM 1.5, 1 sun illumination. While the $V_{OC}$ remains fairly constant, the $I_{SC}$ shows a dependance on the BCP layer thickness, and reaches its maximum value at the BCP layer thickness of about 100 to 120 Å. $V_{OC}$ and $I_{SC}$ show significant drop for the device without BCP layer.
Figure 8:
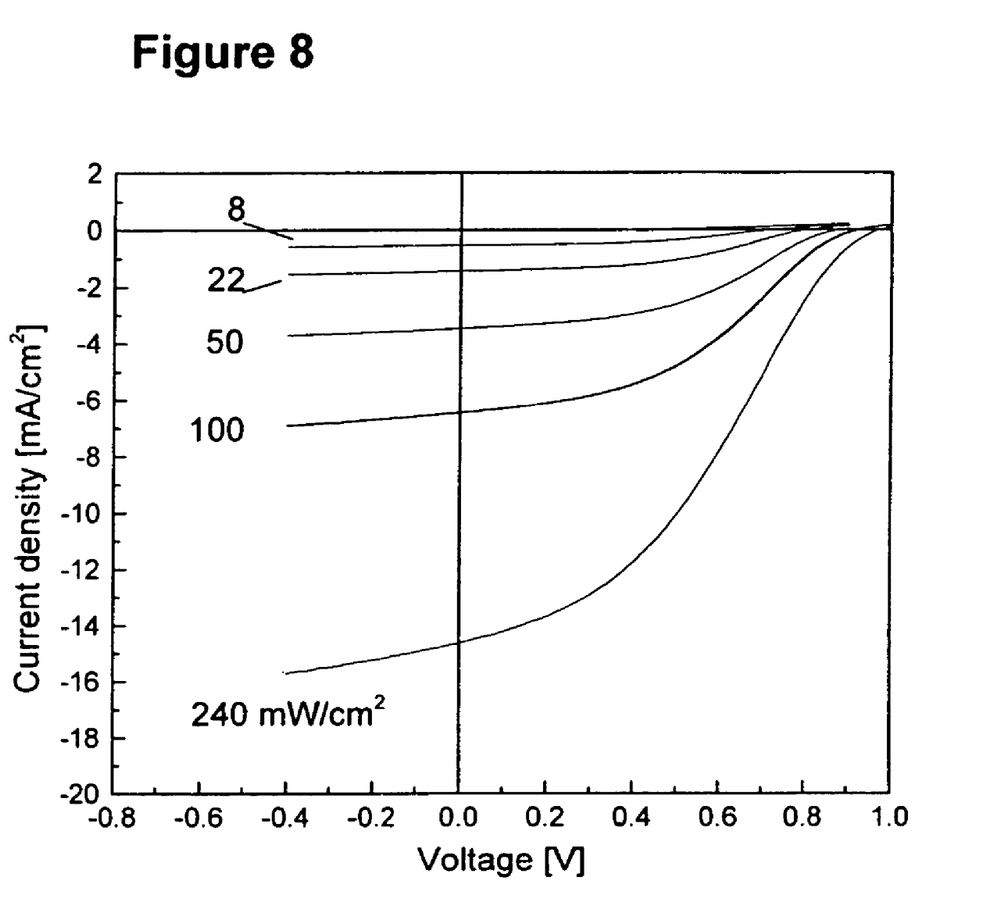
FIG. 8 shows the forth quardrant of the I-V characteristics of an optimized tandem cell: ITO/PEDOT/110 Å CuPc/110 Å PTCBI/5 Å Ag/150 Å CuPc/250 Å PTCBI/800 Å Ag for different incident power densities for an AM 1.5 simulated solar spectrum. Approximately 100 mW/cm² corresponds to 1 sun intensity.
Figure 9:
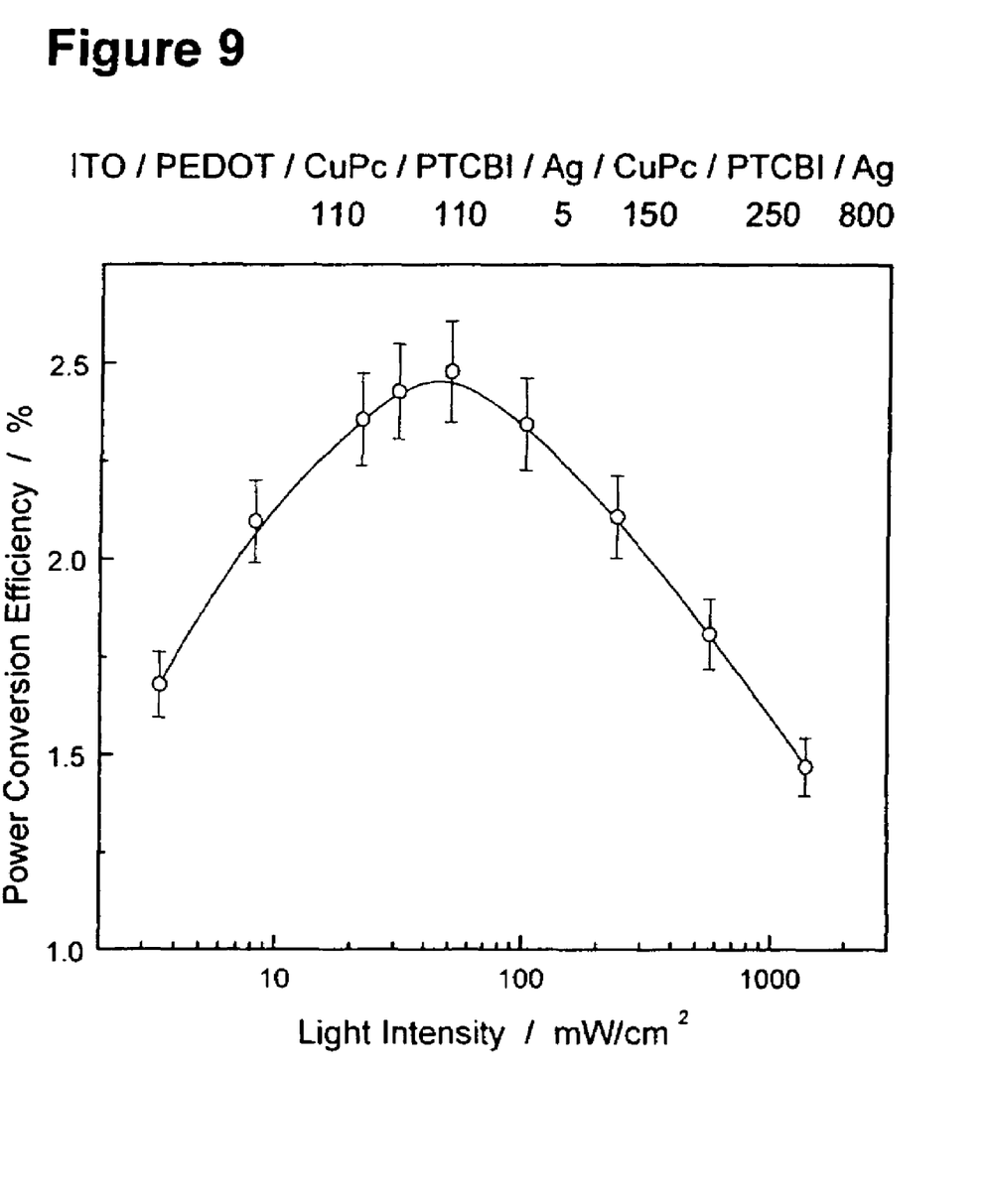
FIG. 9 shows the I-V characteristics of the optimized tandem cell: ITO/PEDOT/110 Å CuPc/110 Å PTCBI/5 Å Ag/150 Å CuPc/250 Å PTCBI/800 Å Ag measured at different incident light intensities. Power conversion efficiency of this optimized tandem device reaches its maximum of about 2.5% at light intensity of 0.5 sun.

Further improvement can be done with the help of exciton blocking layer (EBL) concept. Incorporating large band gap, electron conducting layer (such as BCP) between the acceptor (PTCBI) and electron collecting electrode leads to increase of external quantum efficiency. This was related to BCP ability to prevent exciton diffusion and subsequent exciton quenching at the electrode. In order to check this concept for tandem devices we have prepared PV cells with and without BCP layer. FIG. 5 shows I-V characteristics for tandem devices with (filled squares) and without (open squares) 100 Å BCP layer incorporated in the back cell. The characteristics were measured under 1 sun illumination. Significant increase of the photocurrent density can be clearly seen, thus confirming usefulness of the EBL concept application to tandem PV cells.

While including BCP layer as a part of the back cell (i.e. before thick Ag electrode) seems to be advantageous, introducing it as a art of the front cell (i.e. before thin Ag interlayer) leads to sharp decrease in the device performance. This indicates that transport sites in BCP appear as a secondary result of the deposition of thick Ag layer.

Although the present invention is described with respect to particular examples and preferred embodiments, it is understood that the present invention is not limited to these examples and embodiments. The present invention as claimed may therefore include variations from the particular examples and preferred embodiments described herein, as Will be apparent to one of skill in the art.

What is claimed is:

1. An organic photosensitive optoelectronic device comprising:
    an anode,
    a first subcell comprising an electron donor layer and an electron acceptor layer;
    a second subcell comprising an electron donor layer and an electron acceptor layer;
    an electron-hole recombination zone contacting an organic semiconductor layer of the first subcell and an organic semiconductor layer of the second subcell; and
    a cathode,
    wherein, the electron-hole recombination zone is less than about 20 Å in thickness; and
    wherein, upon illumination of the device, the current generated in the first subcell and the current generated in the second subcell differ by less than about 10%.

2. The device of claim 1, wherein the device further comprises additional subcells separated by electron-hole recombination zones, wherein the current generated by each subcell differs by less than about 10%.

3. The device of claim 1, wherein the device further comprises an exciton blocking layer.

4. The device of claim 3, wherein the exciton blocking layer comprises BCP.

5. The device of claim 1, wherein the electron-hole recombination zone is a semitransparent metal layer.

6. The device of claim 5, wherein the semitransparent metal layer is selected from a layer of Ag, Li, LiF, Al, Ti and Sn.

7. The device of claim 6, wherein the semitransparent metal layer is a layer of Ag.

8. The device of claim 5, wherein the semitransparent metal layer is about 5 Å in thickness.

9. The device of claim 5, wherein the semitransparent metal layer is composed of nanoparticles.

10. The device of claim 1, wherein the device further comprises an anode-smoothing layer.

11. The device of claim 10, wherein the anode-smoothing layer comprises PEDOT.

12. The device of claim 1, wherein the electron donor layer comprises a pthalocyanine or a porphyrin, and the electron acceptor layer comprises a perylene, naphthalene, fullerene or nanotubule.

* * * * *